United States Patent [19]
Zanio et al.

[11] Patent Number: 4,910,154
[45] Date of Patent: Mar. 20, 1990

[54] MANUFACTURE OF MONOLITHIC INFRARED FOCAL PLANE ARRAYS

[75] Inventors: Ken Zanio, El Toro; Ross C. Bean, Santa Ana, both of Calif.

[73] Assignee: Ford Aerospace Corporation, Newport Beach, Calif.

[21] Appl. No.: 289,959

[22] Filed: Dec. 23, 1988

[51] Int. Cl.⁴ .................................................. H01L 27/14
[52] U.S. Cl. ......................................... 437/5; 437/3;
437/126; 437/965; 148/DIG. 64; 357/30
[58] Field of Search .................... 437/3, 5, 126, 102,
437/965; 148/DIG. 64; 357/30

[56] References Cited

U.S. PATENT DOCUMENTS

| 3,793,712 | 2/1974 | Bean et al. | 29/577 |
|---|---|---|---|
| 3,988,774 | 10/1976 | Cohen-Solal et al. | 357/30 |
| 4,141,765 | 2/1979 | Druminski et al. | 148/175 |
| 4,228,365 | 10/1980 | Gutierrez et al. | 437/126 |
| 4,242,149 | 12/1980 | King et al. | 437/936 |
| 4,251,299 | 2/1981 | Baliga et al. | 148/171 |
| 4,273,596 | 6/1981 | Gutierrez et al. | 437/126 |
| 4,276,099 | 6/1981 | Keen et al. | 437/3 |
| 4,312,115 | 1/1982 | Diedrich et al. | 29/572 |
| 4,376,659 | 3/1983 | Castro | 437/128 |
| 4,376,663 | 3/1983 | Wang et al. | 437/126 |
| 4,487,813 | 12/1984 | Kay | 437/102 |
| 4,648,917 | 3/1987 | Kay et al. | 437/102 |
| 4,655,848 | 4/1987 | Kay et al. | 437/102 |
| 4,743,310 | 5/1988 | Kay et al. | 148/DIG. 64 |
| 4,804,638 | 2/1989 | Hoke et al. | 148/DIG. 64 |

FOREIGN PATENT DOCUMENTS

| 55-22866 | 2/1980 | Japan . |
|---|---|---|
| 56-49581 | 5/1981 | Japan . |

Primary Examiner—Brian E. Hearn
Assistant Examiner—Tuan Nguyen
Attorney, Agent, or Firm—Harry G. Weissenberger; Edward J. Radlo; Keith L. Zerschling

[57] ABSTRACT

The manufacture of monolithic HgCdTe detectors and Si circuitry in an IR focal plane array is achieved by forming a protective layer of $SiO_2$ or $SiN_x$ on a silicon wafer containing silicon circuits, etching steep-wall recesses into the wafer, selectively depositing epitaxial single-crystal layers of GaAs, CdTe, and HgCdTe in the recesses fabricating HgCdTe IR arrays, and depositing appropriate insulating and conductive interconnection patterns to interconnect the Si devices with one another and the HgCdTe devices with the Si devices. Little or no GaAs, CdTe, and HgCdTe grows on the $SiO_2$ or $SiN_x$ outside the recesses. Since material grown outside the recess is polycrystalline, it is easily chemomechanically removed.

6 Claims, 3 Drawing Sheets

MANUFACTURE OF MONOLITHIC INFRARED FOCAL PLANE ARRAYS

FIELD OF THE INVENTION

This invention relates to the manufacture of HgCdTe focal plane arrays for infrared imaging systems, and more particularly to the technique of growing HgCdTe detectors on silicon substrates and interconnecting the detectors to silicon devices.

BACKGROUND OF THE INVENTION

In the preparation of HgCdTe photovoltaic focal plane arrays (FPAs) for infrared (IR) imaging, the detector arrays have conventionally been fabricated separately on a bulk single crystal CdTe substrate (16), which is then indium bump bonded in a hybrid fashion to the silicon wafer containing the processing circuitry. The CdTe substrate is expensive and brittle, and frequently of poor quality.

For these reasons, sapphire, GaAs and Si substrates are in various stages of development to replace CdTe. However, the silicon multiplexer must still be bump bonded to these substrates. Such an interconnect is detrimental to the reliability, cost and flexibility of the system utilizing this IRFPA. It is therefore desirable to produce silicon signal processing circuitry on a silicon wafer and to then grow HgCdTe IR detectors on the wafer and interconnect them with the silicon circuitry. This procedure, however, presents several problems.

To begin with, it is not possible to directly grow detector quality HgCdTe on the surface of the silicon wafer. An additional problem is the interconnection of elevated detector arrays with the silicon circuitry. Because the metallic interconnections are vapordeposited in a direction nearly normal to the wafer surface, the steep sides of the detector arrays result in poor metallic step coverage and poor interconnections.

The elevated detector arrays also severely interfere with the photolithographic process of opening up vias to the silicon circuitry for eventual interconnect between the HgCdTe array and the silicon circuitry. The interconnect between the silicon devices becomes impossible when Al rather than a refractory metal is used to interconnect the silicon devices to one another, as the Al must be deposited after the GaAs, CdTe, and HgCdTe growth, and these vias require an even more precise photolithographic process.

References in this field include the following: U.S. Pat. No. 3,793,712, which describes a method of forming areas of different silicon crystal orientation in recesses of a silicon substrate; U.S. Pat. No. 3,988,774 which deals with the manufacture of HgCdTe IR detectors on top of substrate surface; U.S. Pat. No. 141,765 which deals with a method for making flat silicon troughs in a substrate in the production of MOS transistors; U.S. Pat. No. 4,251,299 which deals with refilling grooves in a silicon substrate using liquid phase epitaxial growth from a tin melt; U.S. Pat. No. 4,312,115 in which separate IR detectors are formed on a chip by etching from both sides of the chip; U.S. Pat. No. 4,376,663 which discloses a method of growing CdTe on HgCdTe by liquid phase epitaxy; U.S. Pat. No. 4,646,120 which avoids cross talk through the use of grooves on the outside of the HgCdTe and layers not responsive to IR radiation; Japanese Patent No. 55-22866 which deals with the production of flat MOS circuitry; and Japanese Patent No. 56-49581 which deals with growing a P-N junction in a photodiode involving CdTe on silicon.

DISCLOSURE OF THE INVENTION

In accordance with the invention, it has been found that the growth of detector quality HgCdTe on Si (12) for hybrid focal planes in FIG. 2 requires depositing a GaAs (32) layer, then a CdTe (34) layer and then finally the HgCdTe layer (36), with a total thickness of about 15 microns. By using the CdTe/GaAs interlayers, it has become possible to prepare HgCdTe photovoltaic detectors, or HgCdTe detectors of any kind, on Si. However, it has also been found that a planar technology as shown in FIG. 3 is necessary to allow the interconnection of the HgCdTe arrays with the Si circuits, especially where a non-refractory metal (26) is used to both interconnect (28) the Si devices with the HgCdTe devices and, also to interconnect (28) the Si devices with one another the Si.

To establish a planar process for HgCdTe detectors in accordance with the invention, recesses (30) have been etched on the Si (12). In the prior art, GaAs circuitry has been grown in recesses, but these recesses, prepared by reactive ion etching, were only a few microns deep. The invention uses KOH etch to selectively etch recesses (30) up to 15 microns deep in order to accommodate thick epitaxial films. Single crystal thin films of GaAs (32), CdTe (34) and HgCdTe (36) are then grown in the Si recesses as shown in FIG. 4.

In general, polycrystalline HgCdTe/CdTe/GaAs (37) is also grown outside the recess. However, HgCdTe can be grown selectively in recesses formed in a silicon wafer, by taking advantage of the growth characteristics of the materials involved. Specifically, GaAs sticks better on the bare crystalline silicon surface of the recess (30) than on the $SiO_2$ or $SiN_x$ of the surrounding wafer surface. The sticking coefficient of CdTe is greater on GaAs than on Si, $SiO_2$, or $SiN_x$. Over a narrow temperature range this results in CdTe films on the GaAs and little or none of the Si as shown in FIG. 4. For the growth of CdTe by congruent evaporation in an ultra-high vacuum (UHV) on Si and GaAs/Si. At low substrate temperature ($<400°$ C.), nearly all of the CdTe will stick to both the Si and the GaAs/Si. However, at a higher transition substrate temperature nearly all the CdTe will evaporate from the Si, but most of it will stick to the GaAs. At the highest substrate temperatures, nearly all the CdTe will evaporate from both the Si and GaAs/Si. The transition substrate temperature is approximately 450° C. As the sticking coefficient of HgCdTe is higher on CdTe than on either $SiO_2$, $SiN_x$ or crystalline Si, HgCdTe can be selectively grown on the CdTe.

The effect of these properties is that when a recess is etched in a silicon wafer (12) containing MOS circuitry, and GaAs is deposited on the wafer, a thin (e.g. 3μ) epitaxial layer (32) of GaAs crystals will grow on the bottom and walls of the recess (30) where the crystalline Si has been exposed, to the substantial exclusion of the wafer surface. The subsequent deposition of CdTe creates a thin epitaxial layer (34) (about 6μ) of CdTe on the GaAs to the exclusion of the wafer surface; and finally, the epitaxial deposition of HgCdTe (36) fills the recess (30) to the substantial exclusion of the wafer surface.

The result of these phenomena is the selective growth of HgCdTe IR detectors in only the recesses (30) of the wafer, and with a surface which is even with or slightly above the wafer surface for reliable metal interconnect deposition.

For circumstances where conditions must be used that do not produce highly selective growth, photographic etch and lift-off processes can also be used to remove any polycrystalline growth outside of the recesses.

DESCRIPTION OF THE PREFERRED EMBODIMENT

Figure 1:
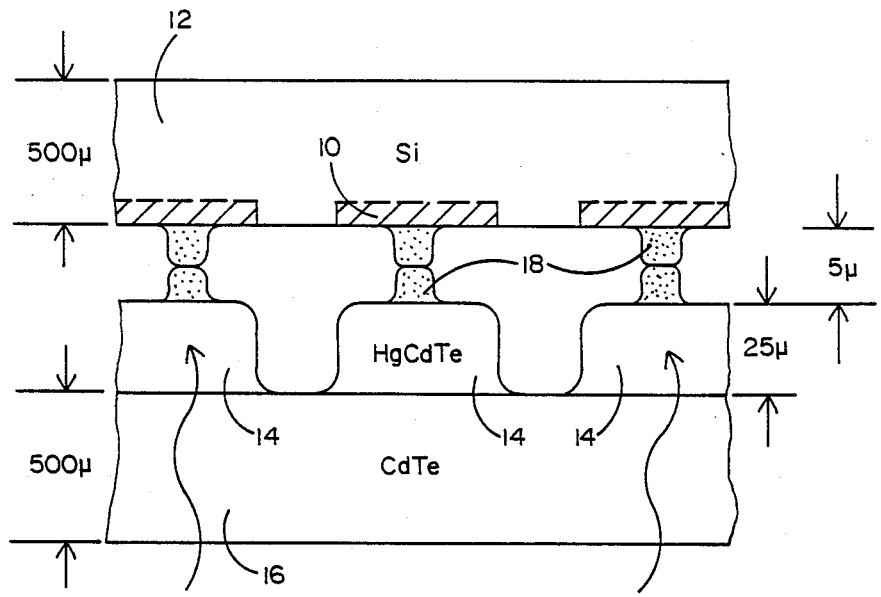
FIG. 1 illustrates the prior art process of making an FPA by indium bonding of separate circuit and detector substrates.

FIG. 1 shows the conventional way of making FPA's, in which the processing circuitry devices 10 were formed on a silicon substrate 12, the HgCdTe IR detectors 14 were separately grown on a CdTe substrate 16, and the two components were interconnected under pressure by indium bumps 18.

Figure 2:
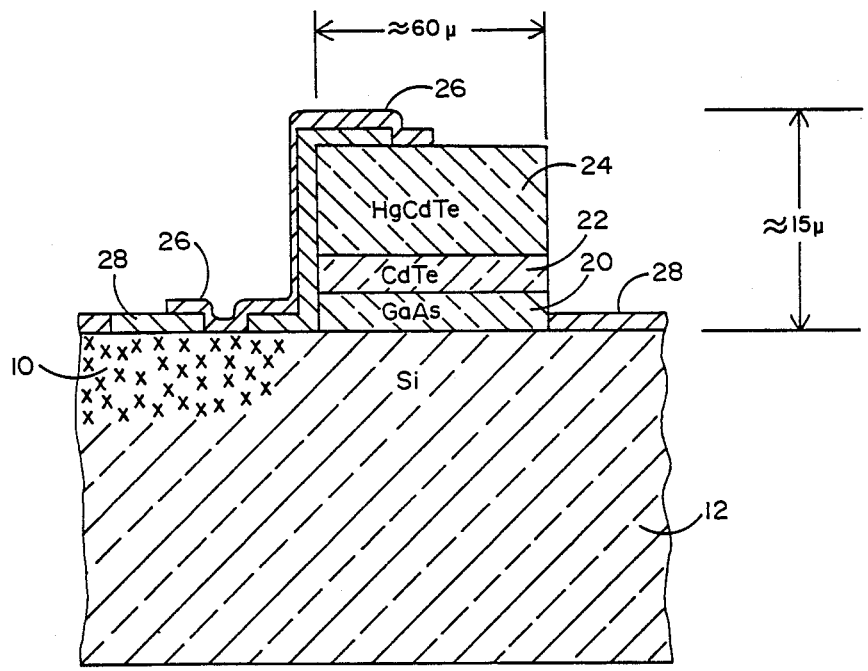
FIG. 2 illustrates the problem created by growing detectors on the surface of the wafer.

Because of the complexity and limited yield and/or reliability of this approach, monolithic fabrication in accordance with the invention was first attempted by growing successive layers 20, 22 and 24, respectively, of GaAs, CdTe and the HgCdTe on the surface of the silicon substrate (FIG. 2). GaAs was used to provide a crystal structure more compatible with CdTe or HgCdTe than Si; and CdTe was used because single-crystal layers of HgCdTe cannot be grown directly on GaAs due to contamination of the HgCdTe by the GaAs.

Due to the total height of which these three layers must be grown, interconnections in arrays made in this manner will however be unreliable because the very thin (about $0.5\mu$) metal layer 26 must be vapor-deposited over the equally thin insulating layer 28 in a direction generally normal to the substrate surface. This will result in high-resistivity interconnects because very little metal will be deposited on the high, substantially vertical edges of the IR detectors.

Figure 3:
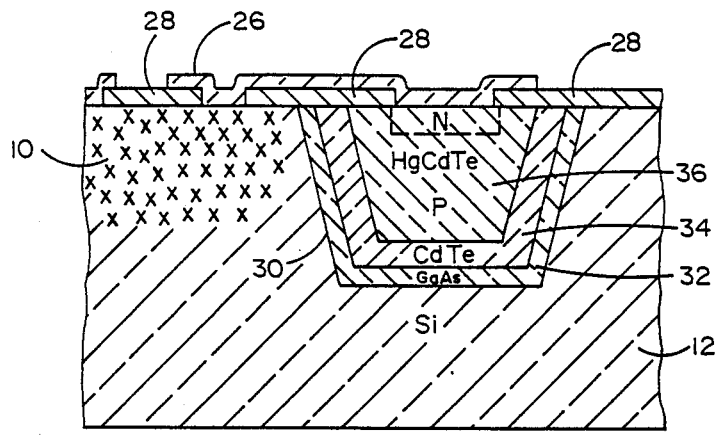
FIG. 3 illustrates the formation of the same detector by the method of this invention.

This problem was overcome in a highly advantageous way by selectively growing the GaAs, CdTe and HgCdTe layers in recesses etched in the Si wafer (FIG. 3). The etching exposes Si surfaces on which selective growth of the detector layers can take place as described in the illustrative example below. The selective growth produces detector-quality HgCdTe embedded in the Si wafer, and detectors which can be interconnected with the wafer circuitry by flat Ae interconnections.

As a matter of example, NMOS CCD circuits to accommodate $1 \times 64$ HgCdTe detector arrays were fabricated as described below on 2cm by 2cm Si substrates. Device fabrication was stopped before Al metallization since subsequent processing steps are above 550° C., the melting point of Al (FIG. 3). After protecting the silicon circuitry by insulating $SiO_2$ and/or $SiN_x$ and opening up vias in the $SiO_2/SiN_x$, recesses 30 with steeply (i.e. about 54.7°) inclined sides were formed in the silicon substrate 12. The recesses 30 can be formed by any conventional process such as plasma or chemical etching techniques. In either event, the recess formation exposes crystal facets of the Si substrate on which a particularly beneficial epitaxial growth of GaAs can take place.

An epitaxial layer of GaAs was next grown through evaporation in an ultra-high vacuum by molecular beam epitaxy (MBE) or metalorganic compound vapor deposition (MOCVD) on the Si substrate heated to 450° C. or 670° C. The GaAs crystals grew as a thin (e.g. $3\mu$) monocrystalline layer 32 on the floor of the recess 30, but a polycrystalline growth or no growth at all occurred on the $SiO_2$ or $SiN_x$ of the wafer surface. The polycrystalline phase, if present at all, is easy to preferentially remove by etching in comparison to the single crystal GaAs in the recess.

Several of the Si wafers were removed from the lot and metallized with Al to determine whether the NMOS CCD circuitry survived the GaAs processing steps. This is the most appropriate place to test the CCD, as the most severe step in the entire process is the removal of an innate $SiO_2$ film on the Si at 1000° C. for 10 minutes prior to GaAs growth. A thin (about $6\mu$) CdTe layer 34 was then epitaxially grown on the GaAs layer 32 by a like process, and the same phenomenon occurred: a monocrystalline layer formed in the recess 30, but an easily removable polycrystalline growth or no growth at all took place on the wafer surface. Finally, a thick ($7\mu$ or more) HgCdTe layer 36 was grown on the CdTe layer 34 to fill the recess 30 by a vapor phase epitaxy (VPE) process such as MBE, MOCVD, or close-spaced vapor epitaxy.

Figure 4:
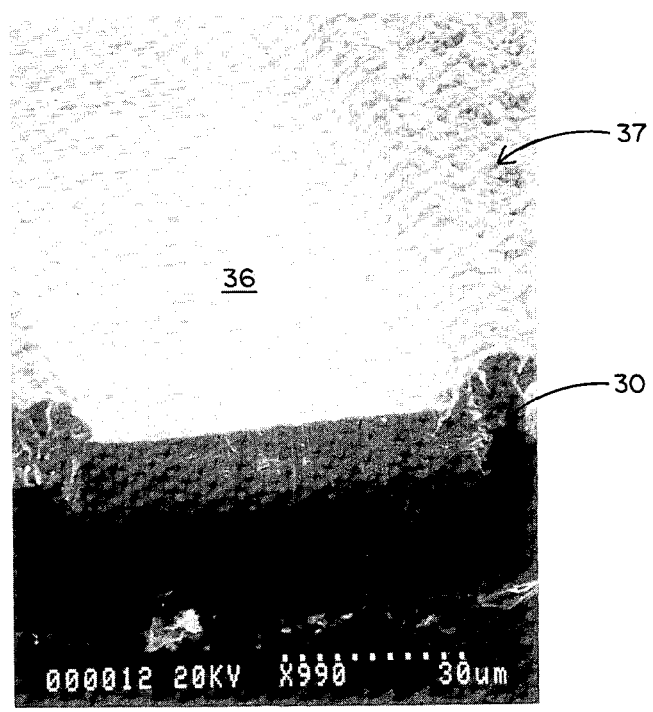
FIG. 4 is a microphotograph illustrating the growth of single crystal HgCdTe in a Si recess through the use of an intermediate CdTe/GaAs layer.

The result was the structure illustrated in FIG. 4, in which the GaAs layer 32, the CdTe layer 34, and the HgCdTe layer 36 can be seen in cross section in the recess 30. The spillover 37 on the edges of the recess 30 is polycrystalline in nature and can easily be removed to produce a flat wafer surface as shown in FIG. 3.

The methodology of the invention also permits the use of a liquid phase epitaxy process, which cannot normally be done in the presence of GaAs because of contamination by the GaAs. In the inventive methodology, the GaAs, at the time of the HgCdTe deposition, has no open surface which can come into contact with the liquid and dissolve therein.

For easier tolerances, the HgCdTe layer 36 may be grown higher than the wafer surface and then chemomechanically polished down to the plane of the wafer surface with methanol bromine.

Finally, the diodes are formed on the FPA through conventional implantation by irradiation with boron ions to form N and P regions (FIG. 3), and the metallic conductor interconnection contacts are vapor-deposited over the appropriately etched insulating layer 28 to complete the array.

Figure 5:
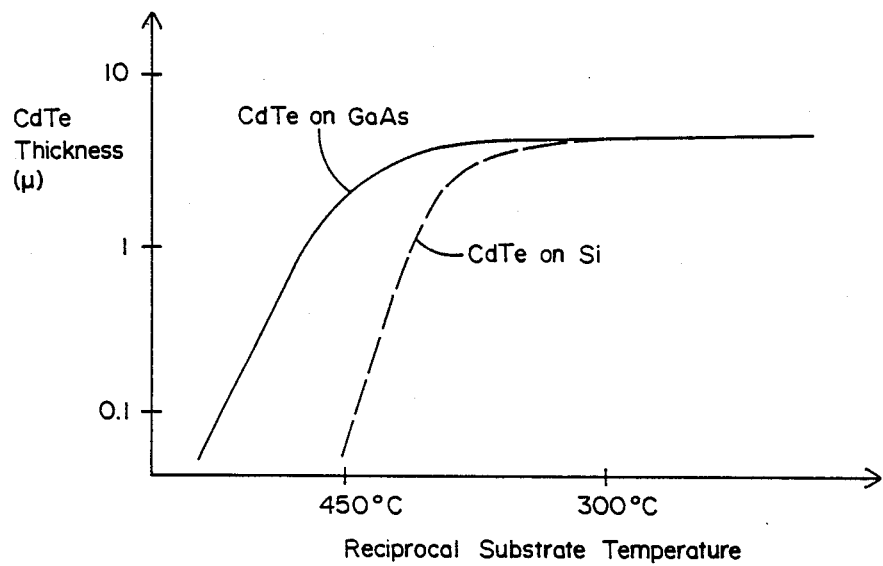
FIG. 5 is a graph illustrating the relative deposition thickness of CdTe on GaAs and Si as a function of reciprocal substrate temperature.

The graph of FIG. 5 illustrates the fact that the deposit thickness for a given amount of deposited CdTe is the same on Si and on GaAs up to a substrate temperature of about 300° C. but that the deposit thickness decreases more rapidly on Si above that temperature than it does on GaAs. AT 450° C., essentially no deposit occurs on Si while a substantial deposit still occurs on GaAs.

Prior to the invention, it was believed that the silicon circuits would not survive (or would at least suffer damage) at the temperatures and vacuums required for the deposition of the GaAs layer. Experience has surprisingly shown, however, that the performance of completed silicon charge-coupled device (CCD) circuitry is not only unimpaired, but actually slightly improved by being subjected to the GaAs deposition process.

Other conventional processes of forming the HgCdTe diodes, such as depositing a second HgCdTe layer of different polarity to form a heterojunction, or diffusing a dopant to change the type of the upper layer of HgCdTe may be used without departing from the invention.

We claim:

1. A method of making monolithic HgCdTe infrared detectors on silicon substrates, comprising the steps of:
   (a) providing a silicon substrate;
   (b) growing on said substrate a layer of GaAs;
   (c) growing on said GaAs layer a layer of CdTe; and
   (d) growing on said CdTe layer a layer of HgCdTe.

2. A method of making interconnected monolithic IR detector HgCdTe FPAs on Si substrates containing Si circuits, comprising the steps of:
   (a) providing a silicon substrate;
   (b) forming silicon signal processing circuitry on said substrate;
   (c) forming on the surface of said substrate a protective layer of a material taken from the group consisting of $SiO_2$ and $SiN_x$; substrate material;
   (d) forming in said substrate a recess exposing the substrate material;
   (e) selectively growing in said recess a thin monocrystalline layer of GaAs;
   (f) growing in said recess on said GaAs layer a thin monocrystalline layer of CdTe;
   (g) selectively growing in said recess on said CdTe layer a monocrystalline layer of HgCdTe sufficiently thick to substantially fill said recess;
   (h) depositing a pattern of insulating material over said HgCdTe layer and said substrate surface; and
   (i) depositing a pattern of metallic interconnecting material over said HgCdTe layer and said substrate surface.

3. The method of claim 2, in which the growth of said GaAs, CdTe and HgCdTe is epitaxial.

4. The method of claim 2, in which at least one of said growing steps includes removing any polycrystalline material which may have formed on said substrate surface during said growing step.

5. The method of claim 2, in which said recess is formed with substantially vertical sides.

6. The method of claim 2, in which said HgCdTe layer is deposited to a thickness beyond that necessary to fill said recess, and said HgCdTe layer is then chemomechanically polished to be level with said substrate surface.

* * * * *

UNITED STATES PATENT AND TRADEMARK OFFICE
CERTIFICATE OF CORRECTION

PATENT NO.   : 4,910,154
DATED        : 20 March 1990
INVENTOR(S)  : Zanio & Bean It is certified that error appears in the above-identified patent and that said Letters Patent is hereby corrected as shown below:

Column 6, line 3     Delete --substrate materials;--

Signed and Sealed this

Ninth Day of April, 1991

Attest:

HARRY F. MANBECK, JR.

*Attesting Officer*            *Commissioner of Patents and Trademarks*